(12) United States Patent
Jones

(10) Patent No.: US 8,154,881 B2
(45) Date of Patent: Apr. 10, 2012

(54) RADIATION-SHIELDED SEMICONDUCTOR ASSEMBLY

(75) Inventor: Roydn Jones, Redondo Beach, CA (US)

(73) Assignee: Telecommunication Systems, Inc., Annapolis, MD (US)

( * ) Notice: Subject to any disclaimer, the term of this patent is extended or adjusted under 35 U.S.C. 154(b) by 1043 days.

(21) Appl. No.: 11/939,084

(22) Filed: Nov. 13, 2007

(65) Prior Publication Data

US 2008/0112150 A1    May 15, 2008

Related U.S. Application Data

(60) Provisional application No. 60/865,603, filed on Nov. 13, 2006.

(51) Int. Cl.
*H05K 7/14* (2006.01)
*H05K 9/00* (2006.01)
*H01L 23/34* (2006.01)

(52) U.S. Cl. ......... 361/800; 361/816; 257/725; 257/728

(58) Field of Classification Search ............. 257/725, 257/728, 659, 660, 723; 361/800, 816
See application file for complete search history.

(56) References Cited

U.S. PATENT DOCUMENTS

| | | | | |
|---|---|---|---|---|
| 4,661,837 A * | 4/1987 | Sono | .................. | 257/660 |
| 5,223,452 A * | 6/1993 | Knepprath | .................. | 438/565 |
| 5,294,826 A * | 3/1994 | Marcantonio et al. | ........ | 257/659 |
| 5,486,720 A * | 1/1996 | Kierse | .................. | 257/659 |
| 5,625,230 A * | 4/1997 | Park et al. | .................. | 257/736 |
| 5,657,206 A * | 8/1997 | Pedersen et al. | .................. | 361/772 |
| 5,675,180 A | 10/1997 | Pedersen et al. | | |
| 5,689,135 A * | 11/1997 | Ball | .................. | 257/676 |
| 5,889,316 A * | 3/1999 | Strobel et al. | .................. | 257/659 |
| 5,898,220 A * | 4/1999 | Ball | .................. | 257/723 |
| 6,124,633 A | 9/2000 | Vindasius et al. | | |
| 6,262,362 B1 * | 7/2001 | Czjakowski et al. | ......... | 174/360 |
| 6,452,253 B1 * | 9/2002 | Tuttle | .................. | 257/659 |
| 6,515,352 B1 * | 2/2003 | Spielberger et al. | .......... | 257/659 |
| 6,566,596 B1 * | 5/2003 | Askew | .................. | 174/391 |
| 6,583,432 B2 * | 6/2003 | Featherby et al. | ......... | 250/515.1 |
| 6,596,937 B2 * | 7/2003 | Mazurkiewicz | .............. | 174/394 |
| 6,603,072 B1 * | 8/2003 | Foster et al. | .................. | 174/536 |
| 6,720,493 B1 * | 4/2004 | Strobel et al. | .................. | 174/388 |
| 6,858,795 B2 | 2/2005 | Czjakowski et al. | | |
| 7,078,243 B2 * | 7/2006 | Spielberger et al. | ............. | 438/3 |
| 7,148,084 B2 | 12/2006 | Strobel et al. | | |
| 7,191,516 B2 | 3/2007 | Patterson | | |
| 7,215,018 B2 | 5/2007 | Vindasius et al. | | |
| 7,245,021 B2 | 7/2007 | Vindasius et al. | | |
| 7,829,980 B2 * | 11/2010 | Molla et al. | ................... | 257/659 |
| 2003/0025180 A1 * | 2/2003 | Alcoe et al. | ................... | 257/659 |
| 2004/0056334 A1 * | 3/2004 | Longden et al. | .............. | 257/660 |
| 2004/0071949 A1 * | 4/2004 | Glatkowski et al. | ........ | 428/313.3 |
| 2005/0011656 A1 * | 1/2005 | Patterson | .................... | 174/35 R |
| 2005/0133916 A1 * | 6/2005 | Karnezos | ..................... | 257/738 |
| 2005/0184378 A1 * | 8/2005 | Sasaki | ............................ | 257/686 |
| 2005/0224952 A1 | 10/2005 | Vindasius et al. | | |
| 2005/0230802 A1 * | 10/2005 | Vindasius et al. | ............ | 257/686 |
| 2005/0269692 A1 * | 12/2005 | Kwon et al. | .................... | 257/723 |
| 2006/0035408 A1 * | 2/2006 | Derderian | ..................... | 438/106 |
| 2006/0172462 A1 * | 8/2006 | Karnezos | ..................... | 438/109 |
| 2006/0237823 A1 * | 10/2006 | Spielberger et al. | ........... | 257/659 |
| 2006/0244117 A1 * | 11/2006 | Karnezos et al. | ............. | 257/678 |

* cited by examiner

*Primary Examiner* — Timothy Thompson
*Assistant Examiner* — Sherman Ng
(74) *Attorney, Agent, or Firm* — William H. Bollman

(57) ABSTRACT

A radiation-shielded semiconductor assembly includes at least one radiation-shielding lamina within the package. In some embodiments, a semiconductor assembly includes a microelectronic component, and at least one radiation-shielding layer affixed to a surface of the component.

66 Claims, 3 Drawing Sheets

RADIATION-SHIELDED SEMICONDUCTOR ASSEMBLY

CROSS-REFERENCE TO RELATED APPLICATION

This application claims priority from U.S. Provisional Application No. 60/865,603, titled "Radiation-shielded semiconductor assembly", which was filed Nov. 13, 2006, and which is hereby incorporated by reference.

BACKGROUND

This invention relates to microelectronics and, particularly, to integrated circuits that may be deployed in environments having elevated levels of ionizing radiation.

Ionizing radiation can have deleterious effects on microelectronics, raising design challenges for microelectronics designed for use in aerospace in nuclear power installations, or in nuclear weapons, for example. In aerospace applications, long-term degradation of performance resulting from cumulative exposure over time (total ionizing dose) can result in eventual failure.

A variety of approaches have been proposed for increasing the total radiation dose durability (and thereby the useful life) of microelectronics for environments having high levels of ionizing radiation. These include, for example, selecting semiconductor materials that are more resistant to effects of radiation; building redundancy into the system or the circuits; and shielding the semiconductor package. Such approaches, when effective, may unacceptably add mass, or unacceptably increase size, or impractically raise cost.

In one approach to shielding a packaged semiconductor die from radiation effects, a cap or cover is installed upon or over the package. The effectiveness of the shield depends upon the thickness of the cover or cap, and the material (typically a metal such as aluminum or copper) of which the cap or cover is made. Some semiconductor die packages are hermetically sealed, typically using a surrounding ceramic or a glass ceramic, and in one approach to shielding such packages, a slug of metal having suitable thermal expansion properties (CTE nearly matched to the ceramic or glass ceramic—typically including a specific combination or alloy of metals, such as a particular copper-tungsten) is embedded in the surrounding ceramic. These shields add significant mass and size, and the materials can be costly.

SUMMARY

According to the invention, a radiation-shielded semiconductor package includes at least one radiation-shielding lamina within the package.

In one general aspect, the invention features a semiconductor assembly that includes a microelectronic component, and at least one radiation-shielding layer affixed to a surface of the component. In some embodiments the component is a semiconductor die having an active surface and a back surface, and the radiation-shielding layer is situated near the back surface, or near the active surface; or radiation-shielding layers are situated near the back surface and the active surface.

In some embodiments a radiation-shielding layer is affixed to the back surface of the die; in such embodiments the radiation-shielding layer is affixed to the die using an adhesive. The adhesive may be a die-attach adhesive, such as a curable epoxy, and may be applied as a liquid or provided as an adhesive film; the adhesive may be electrically insulative, and it may be thermally-conductive.

The radiation-shielding layer includes a material such as a heavy metal or an alloy containing a heavy metal, for example aluminum or copper-tungsten; and the radiation-shielding layer may be a heavy metal or metal alloy sheet. Or, the radiation-shielding layer may be of a polymer-based material, such as an organic polymer containing a metal; an example of such a material is marketed by Longhill Technologies, Inc. under the trade name "PolyRAD".

In some embodiments an isolation layer is disposed on the active surface of the die, and a radiation-shielding layer is affixed to the isolation layer. The isolation layer provides a clearance dimension between the active surface of the die and the radiation-shielding layer sufficient to avoid electrically-conductive contact of the radiation-shielding layer with electrical interconnects on the die. In some such embodiments the isolation layer includes a spacer made of a solid material, such as glass or silicon, and may for example be a "dummy" die; the spacer is affixed to the active surface of the die, and the radiation-shielding layer is affixed to the spacer, using an adhesive. Either of these adhesives may be a die-attach adhesive, such as a curable epoxy, and may be applied as a liquid or provided as an adhesive film; the adhesive may be electrically insulative, and it may be thermally-conductive. In other such embodiments the isolation layer includes spacer elements enclosed in an adhesive material; in such embodiments the spacer elements are generally round (for example, generally ovoid or spherical), and have a diameter selected to provide a suitable clearance dimension between the active surface of the die and the radiation-shielding layer; in such embodiments the isolation layer may be applied as a liquid containing the spacer elements, or as a film containing the spacer elements (in which the film thickness is determined by a spacer element diameter); the enclosing adhesive may be a curable epoxy, and the adhesive may be electrically insulative, and it may be thermally-conductive.

In some embodiments an isolation layer is disposed on the active surface of the die, and a radiation-shielding layer is affixed both to the isolation layer and to the back surface of the die.

In some embodiments at least an edge of the die is covered by an electrically insulative material; in some embodiments at least an edge of the radiation-shielding layer covered by an electrically insulative material. The electrically insulative material may be a polymer, for example an organic polymer such as, for example, a parylene.

In another general aspect the invention features a semiconductor assembly that includes two or more semiconductor die, each having an active surface and a back surface, and at least one radiation-shielding layer affixed to at least one surface of at least one of the die.

In some embodiments a radiation-shielding layer is affixed to the back surface of at least one of the die; in such embodiments the radiation-shielding layer is affixed to the die using an adhesive. The adhesive may be a die-attach adhesive, such as a curable epoxy, and may be applied as a liquid or provided as an adhesive film; the adhesive may be electrically insulative, and it may be thermally-conductive.

In some embodiments an isolation layer is disposed on the active surface of at least one of the die, and a radiation-shielding layer is affixed to the isolation layer. The isolation layer provides a clearance dimension between the active surface of the die and the radiation-shielding layer sufficient to avoid electrically-conductive contact of the radiation-shielding layer with electrical interconnects on the die. In some such embodiments the isolation layer includes a spacer made of a solid material, such as glass or silicon, and may for example be a "dummy" die; the spacer is affixed to the active surface of the die, and the radiation-shielding layer is affixed to the spacer, using an adhesive. Either of these adhesives may be a die-attach adhesive, such as a curable epoxy, and may be applied as a liquid or provided as an adhesive film; the adhesive may be electrically insulative, and it may be thermally-conductive. In other such embodiments the isolation layer includes spacer elements enclosed in an adhesive material; in such embodiments the spacer elements are generally round (for example, generally ovoid or spherical), and have a diameter selected to provide a suitable clearance dimension between the active surface of the die and the radiation-shielding layer; in such embodiments the isolation layer may be applied as a liquid containing the spacer elements, or as a film containing the spacer elements (in which the film thickness is determined by a spacer element diameter); the enclosing adhesive may be a curable epoxy, and the adhesive may be electrically insulative, and it may be thermally-conductive.

In some embodiments an isolation layer is disposed on the active surface of the die, and radiation-shielding layers are affixed to the isolation layer and to the back surface of a die. In some embodiments of the semiconductor assembly a radiation-shielding layer is situated between at least two adjacent die in the stack; in some embodiments a radiation-shielding layer is situated at the top of the stack, and in some embodiments a radiation-shielding layer is situated at the bottom of the stack. In some embodiments the stack includes a radiation-shielding layer directly above and below each die or component.

In another general aspect the invention includes a stackable semiconductor assembly including a semiconductor die, a first radiation-shielding layer affixed to a back surface of the die, and an isolation layer affixed to a front surface of the die.

In another general aspect the invention features a semiconductor package including at least one semiconductor die mounted over a substrate, a first radiation-shielding layer affixed to a back surface of the die, an isolation layer affixed to a front surface of the die, and a second radiation-shielding layer affixed to the isolation layer. In some embodiments the die is mounted with the active surface facing way from the substrate, and the die is electrically connected to the substrate by wire bonds connecting interconnect pads on the die with bond pads on the substrate.

In some embodiments the die is mounted with the active surface facing toward the substrate, and the die is electrically connected to the substrate by flexible conductors connecting interconnect pads on the die with vertical interconnects; the flexible conductors may be metal wires or ribbons; the vertical interconnects may be at an edge of the die; the vertical interconnects may comprise an electrically conductive polymer.

In some embodiments the die has die pads arranged at an edge of the die, and the die pads serve as the interconnect pads. In some embodiments the die is a rerouted die, that is, the die pads are arranged near the center of the die, and electrically conductive traces connect the die pads with interconnect pads arranged at an edge of the die.

In another general aspect the invention includes a stackable semiconductor assembly including a semiconductor die, an isolation layer affixed to a front surface of the die, and a first radiation-shielding layer affixed to the isolation layer.

In another general aspect the invention features a semiconductor package including at least one semiconductor die mounted over a substrate, a first radiation-shielding layer affixed to a back surface of the die, an isolation layer affixed to a front surface of the die, and a second radiation-shielding layer affixed to the isolation layer. In some embodiments the die is mounted with the active surface facing way from the substrate, and the die is electrically connected to the substrate by wire bonds connecting interconnect pads on the die with bond pads on the substrate.

In some embodiments the die is mounted with the active surface facing toward the substrate, and the die is electrically connected to the substrate by flexible conductors connecting interconnect pads on the die with vertical interconnects; the flexible conductors may be metal wires or ribbons; the vertical interconnects may be at an edge of the die; the vertical interconnects may comprise an electrically conductive polymer.

Constructs according to the invention can be used for building computers, telecommunications equipment, and consumer and industrial electronics devices, and can be particularly useful where it is to be deployed or used in an environment having elevated radiation, particularly ionizing radiation.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

Figure 1:
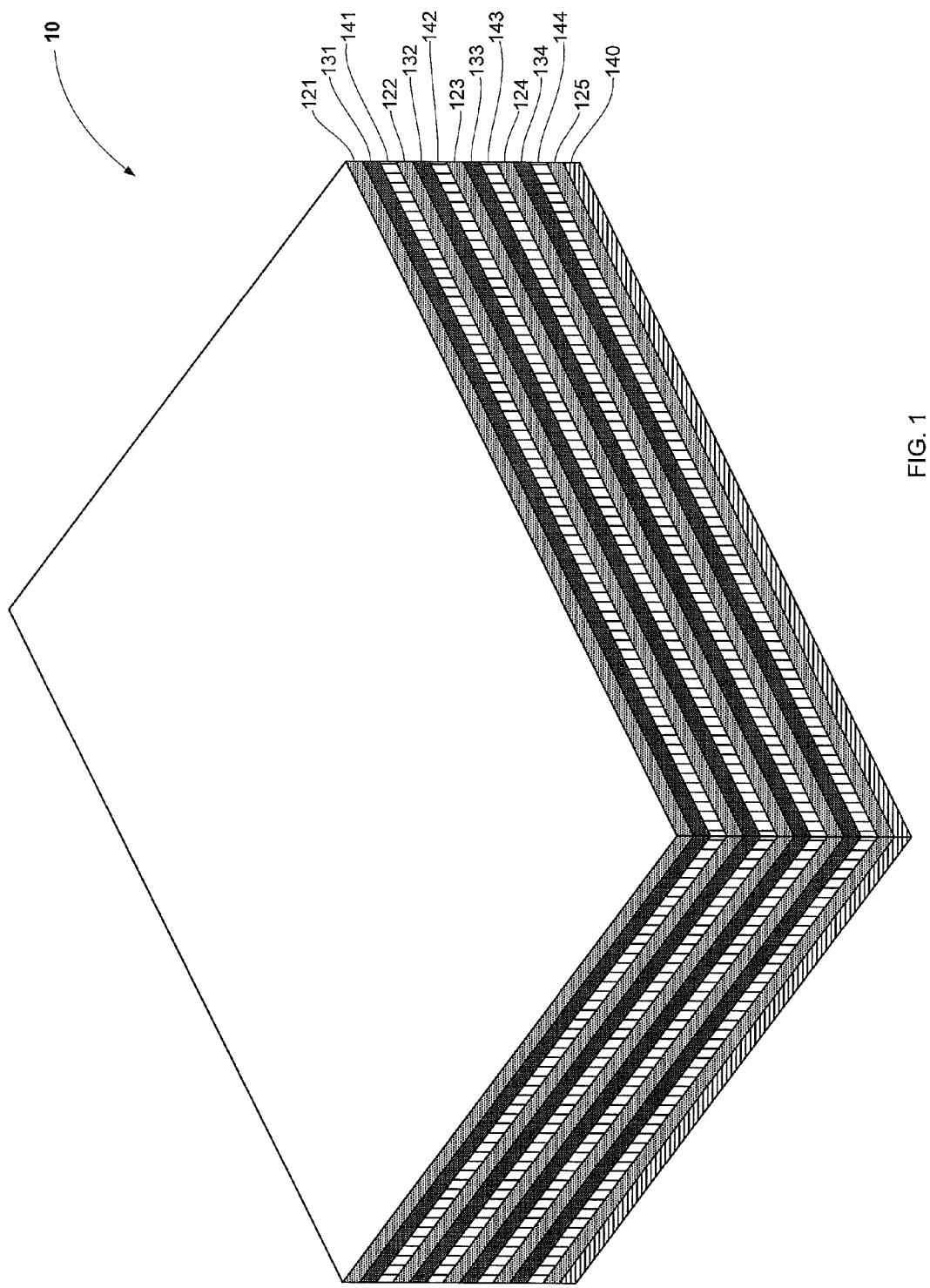
FIG. 1 is a diagrammatic sketch in a three-dimensional view showing a generalized package according to one embodiment of the invention.

Turning now to FIG. 1, there is shown in a diagrammatic isometric view an arrangement of layers in a stacked component assembly 10 according to the invention. The assembly in this example includes a stack of radiation-shielded components mounted on an assembly substrate 140 (which may for example be a ball grid array (BGA) or land grid array (LGA) substrate) by which the components in the stack are mounted to underlying circuitry (not shown) in the device or machine in which the assembly is used. For purposes of illustration the assembly substrate may be referred to in this description as the "bottom" of the assembly, and the part of the stack of radiation-shielded components adjacent the assembly substrate may be referred to as the "bottom" of the stack; and each layer in the assembly may be referred to correspondingly as having an "upper" and a "lower" surface, and may be referred to as being "above" or "below" other layers. The assembly in this example has four microelectronic components 141, 142, 143, 144 (which may be, for example, semiconductor die; or die packages, or passive devices). Every component 141, 142, 143, 144 in this example is provided above and below with radiation-shielding layers 121, 122, 123, 124, 125. Thus, shielding layer 121 is situated above component 141 (at the top of the stack); shielding layer 122 is situated below component 141 and above component 142; shielding layer 123 is situated below component 142 and above component 143; shielding layer 124 is situated below component 143 and above component 144; and shielding layer 125 is situated below component 144 (at the bottom of the stack and adjacent the assembly substrate 140). Between the upper surfaces of the components and the shielding layers above them in this example are isolation layers 131, 132, 133, 134. Thus, isolation layer 131 is situated between shielding layer 121 and component 141; isolation layer 132 is situated between shielding layer 122 and component 142; isolation layer 133 is situated between shielding layer 123 and component 143; isolation layer 134 is situated between shielding layer 124 and component 144. The isolation layers provide clearance for electrical interconnections between the components and the substrate, as explained by way of example with reference to the remaining FIGs. Accordingly, where the interconnections are at the upper surface of a given component the isolation layer is situated between the component and the shielding layer above it (see, for example, FIGS. 2, 3, 6); and, on the other hand, where the interconnections are at the lower surface of a given component the isolation layer is situated between the component and the shielding layer below it (see, for example, FIGS. 4, 5, 7, 8, 9).

Figure 2:
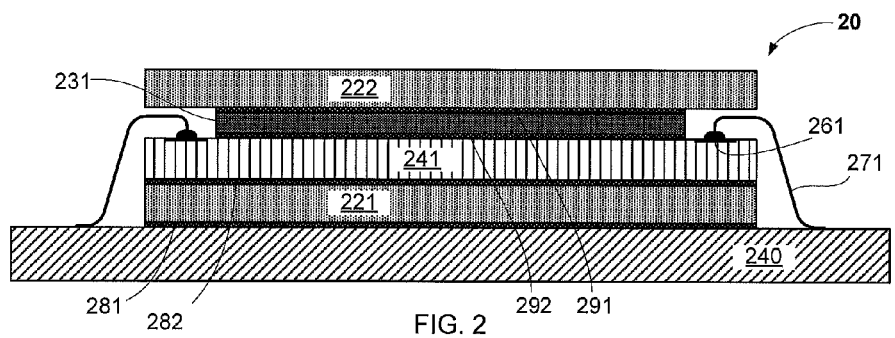
FIG. 2 is a diagrammatic sketch in a sectional view showing an embodiment of a package according to an aspect of the invention, having a radiation-shielded die electrically connected to a substrate by wire bonds.

Referring now to FIG. 2, there is shown by way of example in a sectional view generally at 20 a radiation-shielded die mounted on a substrate and electrically connected by wirebonds. The die 241 has an active surface including interconnect pads 261. The die circuitry may have die pads situated along one or more edges and, in such a die the die pads serve as interconnect pads 261. Or, the die circuitry may have die pads situated inboard from the die edge, (memory die often have die pads situated in one or more rows near a centerline of the die surface, for example), and such a die may according to the invention be a "rerouted" die, in which electrically conductive traces connect the die pads with the peripherally-arranged interconnect pads 261. Rerouted die, and methods for making them, are described, for example, in U.S. Pat. No. 6,124,633.

Radiation-shielding layer 221 is affixed to the back surface of die 241 using an adhesive 282. Isolation layer 231 is affixed to the active surface of die 241 using an adhesive 292. Die 241 is mounted onto a die attach surface of the substrate 240 using an adhesive 281, and the die is electrically connected to the substrate by wire bonds 271 connecting interconnect pads 261 with bond pads (not shown in the FIGs.) on the substrate 240.

Radiation-shielding layer 222 is affixed to the surface of isolation layer 231 using an adhesive 291. The isolation layer provides a clearance between the active surface of the die and the opposed surface of the radiation-shielding layer 221, sufficient to accommodate the loop height of the wire bonds 271. Accordingly, the isolation layer may be thought of as a spacer. Isolation layer 231 is shown in these examples as a solid piece, which may be glass or a "dummy" die, for example. The clearance is established as the sum of the thicknesses of the solid spacer 231 and the cured adhesive layers 291, 292, and may be designed to be slightly greater than the loop height, to provide a tolerance range for variation in loop height.

Alternatively, the isolation layer may be formed as a spacer adhesive layer containing spacer elements dimensioned to limit the movement of the die and the overlying shielding layer toward one another during processing; the spacer elements may be, for example, round (spherical or ovoid) particles having limited compressibility. Glass or polymer (such as organic polymer) spheres or spheroids can be particularly suitable. The clearance is established by the (smaller) diameter of the spherical (or spheroid) particles. Where such a spacer adhesive is used as the isolation layer, no additional adhesive layers need be provided, as the adhesive spacer itself provides adhesion for the adjacent die and shielding layer. The spacer adhesive layer may be applied as a curable epoxy, for example, and may be cured in stages in the course of the assembly process.

Each of adhesives 291, 292, 281, 282 may be, for example, a selected epoxy; the adhesives may be applied as a liquid and subsequently cured, or, the adhesives may be an adhesive film. Similar adhesives or the same may be used for any of these. Where electrical insulation is desired, an electrically nonconductive adhesive is preferred. A thermally conductive adhesive may be desired, to facilitate heat conduction away from the components.

Figure 3:
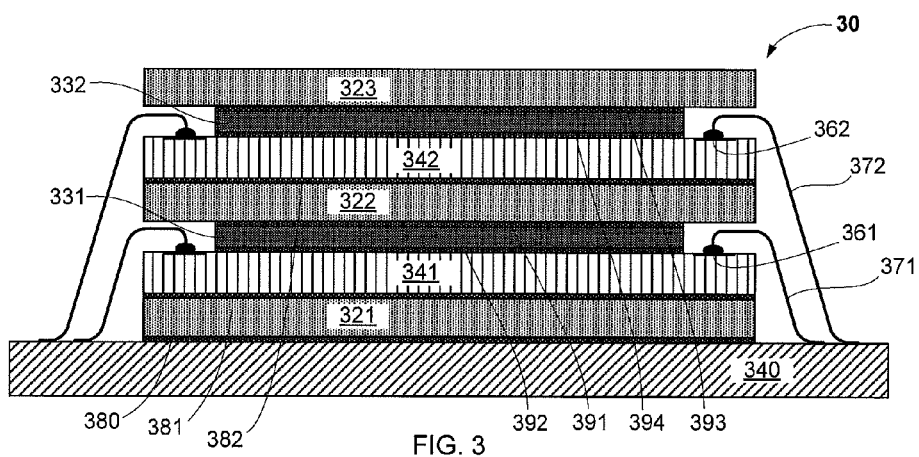
FIG. 3 is a diagrammatic sketch in a sectional view showing an embodiment of a package according to an aspect of the invention, having two radiation-shielded die electrically connected to a substrate by wire bonds.

Two or more radiation-shielded die may be stacked and mounted on a substrate and electrically connected by wirebonds, as shown by way of example in a sectional view in FIG. 3. Here the stacked component assembly 30 includes die 341 and 342; radiation-shielding layers 321, 322, 323; isolation layers 331, 332; all mounted on substrate 340. Shielding layer 321 is affixed to the backside of die 341 using adhesive 381, and shielding layer 322 is affixed to the backside of die 342 using adhesive 381. Isolation layer 331 is affixed to the active surface of die 341 using adhesive 392, and isolation layer 332 is affixed to the active surface of die 342 using adhesive 394. Shielding layer 321 is affixed to the die attach surface of substrate 340 using adhesive 380, shielding layer 322 is affixed to the surface of isolation layer 331 using adhesive 391, and shielding layer 323 is affixed to the surface of isolation layer 332 using adhesive 393. Following mounting of the shielding layer 321 onto substrate 340, and prior to stacking of shielding layer 322 over isolation layer 331 on die 341, wire bonds 371 are formed to connect interconnect pads 361 on die 341 with bond pads (not shown in the FIGs.) on the substrate 340. Following mounting of the shielding layer 322 onto isolation layer 331, and prior to stacking of shielding layer 323 over isolation layer 332 on die 342, wire bonds 372 are formed to connect interconnect pads 362 on die 342 with bond pads (not shown in the FIGs.) on the substrate 340. Shielding layer 323 is affixed to isolation layer 332 following wire bond 372 formations.

The examples of FIGS. 2 and 3, the die are mounted with the active surfaces facing away from the substrate, and the interconnection is made by way of wire bonds. In other embodiments, shown by way of example in FIGS. 4 and 5, the die are mounted with the active surfaces facing toward the substrate, and the interconnection is made by way of laterally-projecting wires or ribbons connecting the interconnect pads on the die with vertical interconnects. Examples of such an arrangement are described, for example, in U.S. Pat. No. 7,215,018 and U.S. Pat. No. 7,245,021; and in U.S. Pat. No. 5,675,180 and other U.S. Patents related thereto as Continuations or as Continuations-in-Part.

Figure 4:
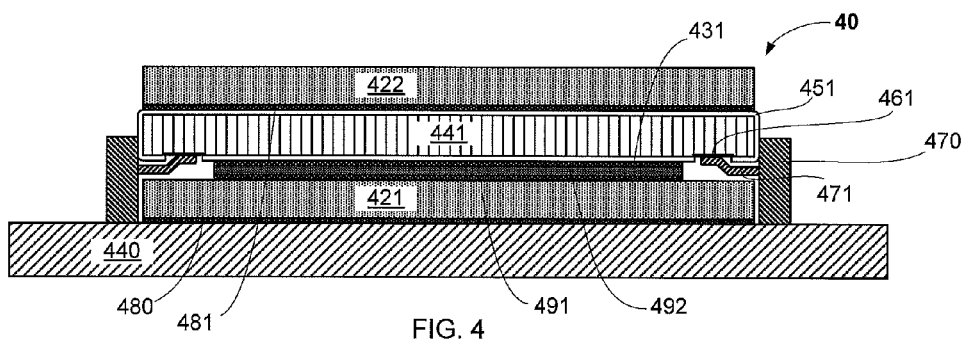
FIG. 4 is a diagrammatic sketch in a sectional view showing an embodiment of a package according to an aspect of the invention, having a radiation-shielded die electrically connected to a substrate by vertical interconnection.

Referring now to FIG. 4, there is shown by way of example in a sectional view generally at 40 a radiation-shielded die mounted on a substrate and electrically connected by vertical interconnects. The die 441 has an active surface including interconnect pads 461. The die circuitry may have die pads situated along one or more edges and in such a die the die pads serve as interconnect pads 461. Or, the die circuitry may have die pads situated inboard from the die edge, (memory die often have die pads situated in one or more rows near a centerline of the die surface, for example), and such a die may according to the invention be a "rerouted" die, in which electrically conductive traces connect the die pads with the peripherally-arranged interconnect pads 461. Rerouted die, and methods for making them, are described, for example, in U.S. Pat. No. 6,124,633. Laterally-projecting wires or ribbons 471 are connected to interconnect pads 461.

In the examples shown in FIGS. 4, 5, 7, 8 and 9, the die is covered with an electrically insulative material (e.g., 451, 551, 552); in these examples the material covers both die surfaces (upper and lower) and the edges. The interconnect pads are exposed by openings through the covering material. The covering material provides both electrical insulation (inasmuch as the vertical interconnects are near the die edges) and mechanical protection from damage resulting from manipulation of the die during processing. Accordingly, for insulation against the interconnects, such covering need only be applied to the edges of the die where interconnects are present. The covering material may be, for example, an organic polymer such as, for example, a parylene. Examples of such coverings, provided as conformal coatings, are described, for example, in U.S. Patent Publication US 2005/0224952.

The radiation-shielding layers may be electrically conductive and, accordingly, it may be advantageous to cover the radiation-shielding layers with a similar electrically insulative material.

Radiation-shielding layer 422 is affixed to the back surface of die 441 using an adhesive 481. Isolation layer 431 is affixed to the active surface of die 441 using an adhesive 492, and is affixed to shielding layer 421 using an adhesive layer 491. Shielding layer 421 is mounted onto a die attach surface of the substrate 440 using an adhesive 480, and the die is electrically connected to the substrate by connection of the wires or ribbons 471 to vertical interconnects 470, which are connected to bond pads (not shown in the FIGs.) on the substrate 440.

Isolation layer 431 provides a clearance between the active surface of the die 441 and the opposed surface of the radiation-shielding layer 421, sufficient to accommodate the laterally-projecting wires or ribbons 471. Accordingly, the isolation layer may be thought of as a spacer. Isolation layer 431 is shown in these examples as a solid piece, which may be glass or a "dummy" die, for example. The clearance is established as the sum of the thicknesses of the solid spacer 431 and the cured adhesive layers 491, 492, and may be designed to be height of the wires or ribbons 471, to provide a tolerance range for height variation.

Alternatively, the isolation layer may be formed as a spacer adhesive layer containing spacer elements dimensioned to limit the movement of the die and the overlying shielding layer toward one another during processing; the spacer elements may be, for example, round (spherical or ovoid) particles having limited compressibility. Glass or polymer (such as organic polymer) spheres or spheroids can be particularly suitable. The clearance is established by the (smaller) diameter of the spherical (or spheroid) particles. Where such a spacer adhesive is used as the isolation layer, no additional adhesive layers need be provided, as the adhesive spacer itself provides adhesion for the adjacent die and shielding layer. The spacer adhesive layer may be applied as a curable epoxy, for example, and may be cured in stages in the course of the assembly process.

Each of adhesives 491, 492, 480, 481 may be, for example, a selected epoxy; the adhesives may be applied as a liquid and subsequently cured, or, the adhesives may be an adhesive film. Where electrical insulation is desired, an electrically nonconductive adhesive is preferred. A thermally conductive adhesive may be desired, to facilitate heat conduction away from the components.

Figure 5:
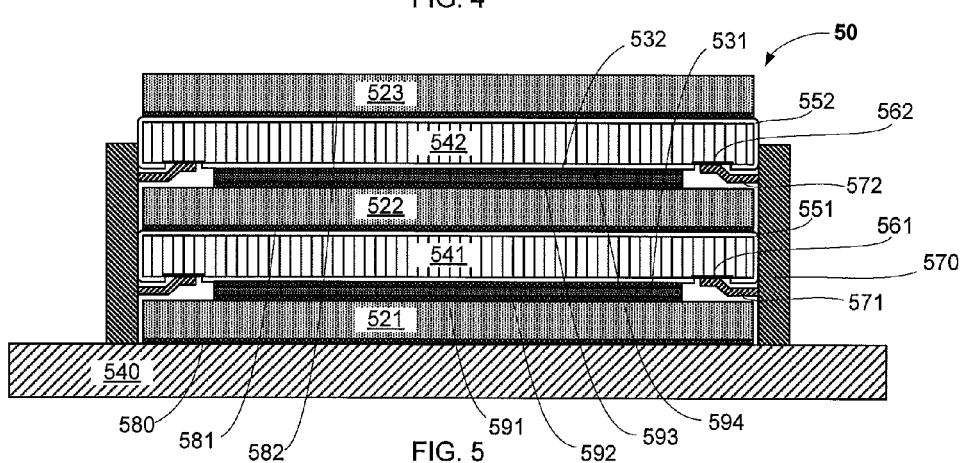
FIG. 5 is a diagrammatic sketch in a sectional view showing an embodiment of a package according to an aspect of the invention, having two radiation-shielded die electrically connected to a substrate by vertical interconnection.

Two or more radiation-shielded die may be stacked and mounted on a substrate and electrically connected by vertical interconnects, as shown by way of example in a sectional view in FIG. 5. Here the stacked component assembly 50 includes die 541 and 542; radiation-shielding layers 521, 522, 523; isolation layers 531, 532; all mounted on substrate 540. Shielding layer 522 is affixed to the backside of die 541 using adhesive 581, and shielding layer 523 is affixed to the backside of die 542 using adhesive 582. Isolation layer 531 is affixed to the active surface of die 541 using adhesive 592, and isolation layer 532 is affixed to the active surface of die 542 using adhesive 594. Shielding layer 521 is affixed to the die attach surface of substrate 540 using adhesive 580, isolation layer 531 is affixed to shielding layer 521 using adhesive 591, and isolation layer 532 is affixed to shielding layer 522 using adhesive 593. Shielding layer 523 is affixed to die 542. Interconnection of the laterally-projecting wires or ribbons 571, 572 to the substrate by way of vertical interconnects 570 can be made following a step of mounting the stack on the substrate.

As may be appreciated, assemblies including a stack of more than two (for example, three, or four, or more) radiation-shielded die according to the invention may be constructed. Also, as may be appreciated, manufacture of the various assemblies may proceed in any of a variety of sequences of steps, excepting the following, in particular: where a component (such as a die) is to be wire-bonded to the substrate, and where a component or layer to be stacked over the die will overhang the interconnect pads, wire bonding must be carried out before the overstacked layer is mounted.

Accordingly, advance provision of stackable assemblies can facilitate manufacture. Particularly, for example, FIGS. 6, 7, 8, and 9 illustrate examples of stackable assemblies that may be provided, and then stacked in desired numbers and affixed to a substrate or other circuitry, and interconnected as appropriate. As noted above, depending upon the dimensions of overlying components in the stack, die or components to be wire bonded to the substrate or other circuitry will as a practical matter be attached and electrically connected one at a time. On the other hand, where the die or components are to be electrically connected by laterally-projecting wires or ribbons, a desired number die assemblies, with shields affixed thereto, may be stacked and then interconnected at the time of or following mounting on the substrate or other circuitry.

Figure 6:
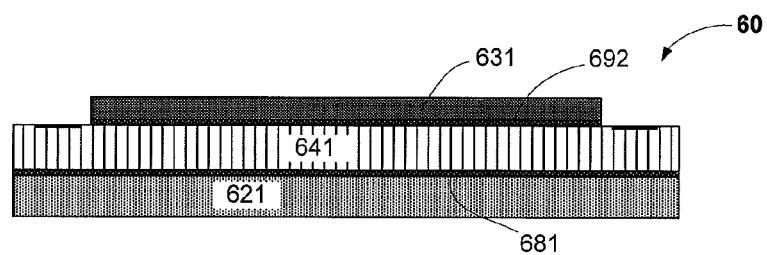
FIG. 6 is a diagrammatic sketch in a sectional view showing an embodiment of a stackable semiconductor die assembly according to an aspect of the invention, having a radiation shield layer affixed to the back surface of the die, and an isolation layer affixed to the active surface of the die.

Referring now to a stackable assembly as shown by way of example at 60 in FIG. 6, a shielding layer 621 is affixed to the back surface of a component (such as a die) 641 using an adhesive 681, and an isolation (spacer) layer 631 is affixed to the active surface of the component (die) 641 using an adhesive 692. Two or more of such stackable assemblies can be used, by use of additional adhesives, by serial formation of wire bonds, and by use of a top shielding layer, to form a stacked assembly of any desired number of components, such as the two-component assembly shown by way of example in FIG. 3.

Figure 7:
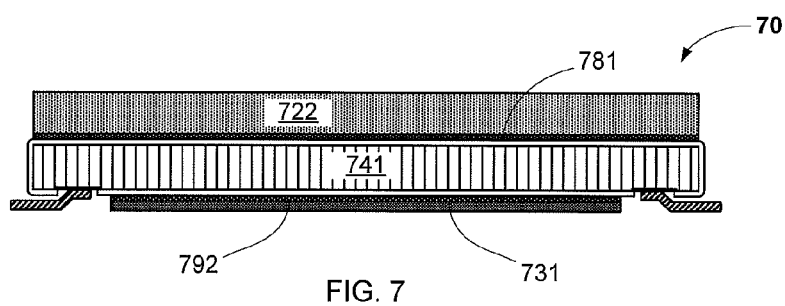
FIG. 7 is a diagrammatic sketch in a sectional view showing an embodiment of a stackable semiconductor die assembly according to another aspect of the invention, having a radiation shield layer affixed to the back surface of the die, and an isolation layer affixed to the active surface of the die.

And referring to a stackable assembly as shown by way of example at 70 in FIG. 7, a shielding layer 722 is affixed to the back surface of a component (such as a die) 741 using an adhesive 781, and an isolation layer 731 is affixed to the active surface the component (die) 741 using an adhesive 792.

Figure 8:
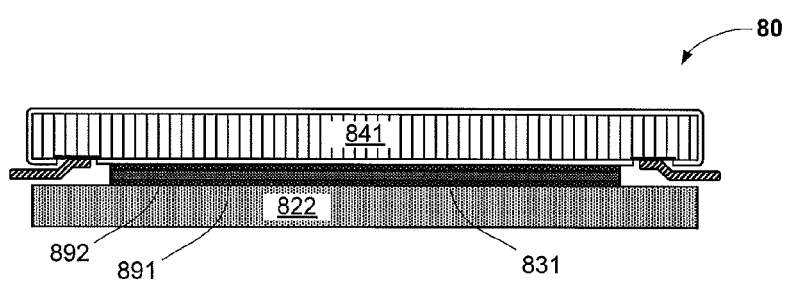
FIG. 8 is a diagrammatic sketch in a sectional view showing an embodiment of a stackable semiconductor die assembly according to an aspect of the invention, having an isolation layer affixed to the active surface of the die, and a radiation shield layer affixed to the isolation layer.

And referring to a stackable assembly as shown by way of example at 80 in FIG. 8, an isolation (spacer) layer 831 is affixed to the active surface the component (die) 841 using an adhesive 892, and a shielding layer 822 is affixed to the surface of the isolation (spacer) layer 831 using an adhesive 891.

Figure 9:
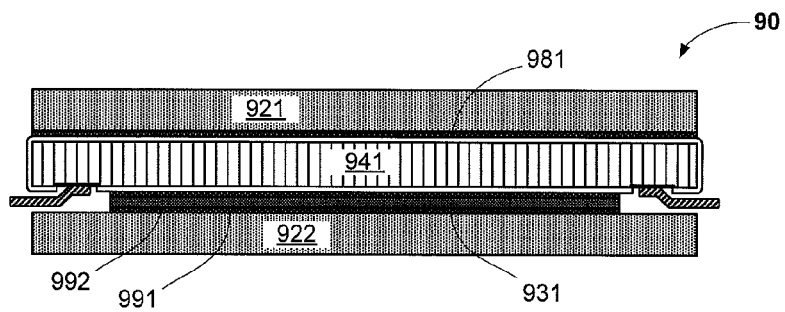
FIG. 9 is a diagrammatic sketch in a sectional view showing an embodiment of a stackable semiconductor die assembly according to another aspect of the invention, having a radiation shield layer affixed to the back surface of the die, an isolation layer affixed to the active surface of the die, and a radiation shield layer affixed to the radiation shield layer.

And referring to a stackable assembly as shown by way of example at 90 in FIG. 9, an isolation (spacer) layer 931 is affixed to the active surface the component (die) 941 using an adhesive 992, and a shielding layer 922 is affixed to the surface of the isolation (spacer) layer 931 using an adhesive 991; and a shielding layer 921 is affixed to the back surface of the component (die) 941 using an adhesive 981.

The invention can provide a reduction of total dose radiation to components. Effective shielding can be accomplished using less mass of shielding material in a dimensionally smaller device.

Other embodiments are within the claims. For example, components other than die may be provided with shielding layers. Accordingly, a module according to the invention may include a semiconductor package, having a die mounted upon and electronically connected to, a substrate, and optionally a molding or encapsulation covering the die and electrical interconnections. The package has two major surfaces: one being the land surface of the substrate (opposite the die attach surface), and the other being a surface of the die or a surface of the encapsulation or molding. A shield layer may accordingly be affixed to one or both package surfaces. Such a package may be stacked in the module with other components, such as one or more semiconductor die and one or more passive components; and shielding may be provided in the stack for one or more of these components.

And, for example, in addition to shielding layers next to the component or stacked components, radiation shielding materials may be formed additionally at the edges of the component or stack as well as at the top.

And, for example, other approaches to stacking may be employed according to the invention. For example, components (die or packages) may be mounted on a flexible substrate and stacked by folding the flexible substrate to bring the exposed surfaces of the components together, using an adhesive between the apposed surfaces to affix the components to one another.

All patents and patent publications referred to herein are incorporated by reference.

I claim:

1. A semiconductor assembly, comprising:
   a semiconductor die;
   at least one first radiation-shielding layer affixed to a back surface of said semiconductor die and which corresponds substantially equally in size to said semiconductor die; and
   at least one second radiation-shielding layer affixed to a front surface of said semiconductor die and which corresponds substantially equally in size to said semiconductor die.
2. The semiconductor assembly of claim 1, wherein:
   said semiconductor die has an active surface.
3. The semiconductor assembly of claim 1, wherein:
   said at least one first radiation-shielding layer is affixed to said back surface of said semiconductor die.
4. The semiconductor assembly of claim 2, wherein:
   said at least one first radiation-shielding layer is affixed to said active surface of said semiconductor die.
5. The semiconductor assembly of claim 1, wherein:
   said at least one first radiation-shielding layer is affixed to said back surface of said semiconductor die using an adhesive.
6. The semiconductor assembly of claim 5, wherein:
   said adhesive is a die-attach adhesive.
7. The semiconductor assembly of claim 5, wherein:
   said adhesive is a curable epoxy.
8. The semiconductor assembly of claim 5, wherein:
   said adhesive is an adhesive film.
9. The semiconductor assembly of claim 5, wherein:
   said adhesive is electrically insulative.
10. The semiconductor assembly of claim 5, wherein:
    said adhesive is thermally conductive.
11. The semiconductor assembly of claim 1, wherein:
    said at least one first radiation-shielding layer comprises a material comprising a heavy metal.
12. The semiconductor assembly of claim 1, wherein:
    said at least one first radiation-shielding layer comprises an alloy containing a heavy metal.
13. The semiconductor assembly of claim 1, wherein:
    said at least one first radiation-shielding layer comprises a material comprising aluminum.
14. The semiconductor assembly of claim 1, wherein:
    said at least one first radiation-shielding layer comprises a material comprising copper-tungsten.
15. The semiconductor assembly of claim 1, wherein:
    said at least one first radiation-shielding layer comprises a heavy metal sheet.
16. The semiconductor assembly of claim 1, wherein:
    said at least one first radiation-shielding layer comprises a metal alloy sheet.
17. The semiconductor assembly of claim 1, wherein:
    said at least one first radiation-shielding layer comprises a polymer-based material.
18. The semiconductor assembly of claim 1, wherein:
    said at least one first radiation-shielding layer comprises an organic polymer containing a metal.
19. The semiconductor assembly of claim 1, wherein:
    an isolation layer is disposed on said active surface of said semiconductor die, and said at least one first radiation-shielding layer is affixed to said isolation layer.

20. The semiconductor assembly of claim 19, wherein:
said isolation layer comprises a spacer made of a solid material.

21. The semiconductor assembly of claim 19, wherein:
said isolation layer comprises a spacer made of a glass.

22. The semiconductor assembly of claim 19, wherein:
said isolation layer comprises a spacer made of a silicon.

23. The semiconductor assembly of claim 19, wherein:
said isolation layer comprises a "dummy" die.

24. The semiconductor assembly of claim 20, wherein:
said spacer is affixed to said semiconductor die using a first adhesive and said at least one first radiation-shielding layer is affixed to said spacer using a second adhesive.

25. The semiconductor assembly of claim 24, wherein:
at least one of said first adhesive and said second adhesive comprises a die-attach adhesive.

26. The semiconductor assembly of claim 25, wherein:
said at least one adhesive is a die-attach adhesive.

27. The semiconductor assembly of claim 25, wherein:
said at least one adhesive is a curable epoxy or an adhesive film.

28. The semiconductor assembly of claim 25, wherein:
said at least one adhesive is electrically insulative.

29. The semiconductor assembly of claim 25, wherein:
said at least one adhesive is thermally conductive.

30. The semiconductor assembly of claim 19, wherein:
said isolation layer comprises spacer elements enclosed in an adhesive material.

31. The semiconductor assembly of claim 30, wherein:
said spacer elements are generally round and have a diameter selected to provide a suitable clearance dimension between said active surface of said semiconductor die and said at least one first radiation-shielding layer.

32. The semiconductor assembly of claim 30, wherein:
said isolation layer is applied as a liquid containing said spacer elements.

33. The semiconductor assembly of claim 30, wherein:
said isolation layer is applied as a film containing said spacer elements, whereby said film thickness is determined by a spacer element diameter.

34. The semiconductor assembly of claim 30, wherein:
said enclosing adhesive material comprises a curable epoxy.

35. The semiconductor assembly of claim 30, wherein:
said enclosing adhesive material is electrically insulative.

36. The semiconductor assembly of claim 30, wherein:
said enclosing adhesive material is thermally conductive.

37. The semiconductor assembly of claim 1, wherein:
an isolation layer is disposed on said active surface of said semiconductor die.

38. The semiconductor assembly of claim 1, wherein:
at least an edge of said semiconductor die is covered by an electrically insulative material.

39. The semiconductor assembly of claim 1, wherein:
at least an edge of said at least one first radiation-shielding layer is covered by an electrically insulative material.

40. The semiconductor assembly of claim 38, wherein:
said electrically insulative material comprises an organic polymer.

41. The semiconductor assembly of claim 40, wherein:
said electrically insulative material comprises a conformal parylene coating.

42. A semiconductor assembly, comprising:
at least two semiconductor die, each having a front surface and a back surface;
at least one first radiation-shielding layer affixed to said back surface of at least one of said at least two semiconductor die and which corresponds substantially equally in size to at least one of said at least two semiconductor die; and
at least one second radiation-shielding layer affixed to a front surface of at least one of said at least two semiconductor die and which corresponds substantially equally in size to at least one of said at least two semiconductor die.

43. The semiconductor assembly of claim 42, wherein:
said first radiation-shielding layer is affixed to said back surface of at least one of said at least two semiconductor die.

44. The semiconductor assembly of claim 42, wherein:
said first radiation-shielding layer is affixed to said at least two semiconductor die using an adhesive.

45. The semiconductor assembly of claim 44, wherein:
said adhesive comprises a die-attach adhesive.

46. The semiconductor assembly of claim 44, wherein:
said adhesive is a curable epoxy or an adhesive film.

47. The semiconductor assembly of claim 44, wherein:
said adhesive is electrically insulative.

48. The semiconductor assembly of claim 44, wherein:
said adhesive is thermally conductive.

49. The semiconductor assembly of claim 42, wherein:
an isolation layer is disposed on an active surface of at least one of said at least two semiconductor die, and a radiation-shielding layer is affixed to an isolation layer.

50. The semiconductor assembly of claim 49, wherein:
said isolation layer comprises a spacer made of a solid material.

51. The semiconductor assembly of claim 49, wherein:
said isolation layer comprises spacer elements enclosed in an adhesive material.

52. A stackable semiconductor assembly, comprising:
a semiconductor die;
a first radiation-shielding layer affixed to a back surface of said semiconductor die and which corresponds substantially equally in size to said semiconductor die;
an isolation layer affixed to said semiconductor die; and
a second radiation-shielding layer affixed to said isolation layer, said second radiation-shielding layer affixed to a front surface of said semiconductor die and which corresponds substantially equally in size to said semiconductor die.

53. A stackable semiconductor package, comprising:
at least one semiconductor die mounted over a substrate;
a first radiation-shielding layer affixed to a back surface of said at least one semiconductor die and which corresponds substantially equally in size to said at least one semiconductor die;
an isolation layer affixed to a front surface of said at least one semiconductor die; and
a second radiation-shielding layer affixed to said isolation layer and which corresponds substantially equally in size to said at least one semiconductor die.

54. The stackable semiconductor package of claim 53, wherein:
said at least one semiconductor die is mounted with an active surface facing way from said substrate, and said at least one semiconductor die is electrically connected to said substrate by wire bonds connecting interconnect pads on said at least one semiconductor die with bond pads on said substrate.

55. The stackable semiconductor package of claim 53, wherein:
said at least one semiconductor die is mounted with an active surface facing toward said substrate, and said at least one semiconductor die is electrically connected to said substrate by flexible conductors connecting interconnect pads on said at least one semiconductor die with vertical interconnects.

56. The stackable semiconductor package of claim 55, wherein:
said flexible conductors comprise metal wires or ribbons.

57. The stackable semiconductor package of claim 55, wherein:
said vertical interconnects are at an edge of said at least one semiconductor die.

58. The stackable semiconductor package of claim 55, wherein:
said vertical interconnects comprise an electrically conductive polymer.

59. The stackable semiconductor package of claim 53, wherein:
said at least one semiconductor die has die pads arranged at an edge of said at least one semiconductor die, and wherein said at least one semiconductor die pads serve as interconnect pads.

60. The stackable semiconductor package of claim 53, wherein:
said at least one semiconductor die is a rerouted die.

61. A stackable semiconductor assembly, comprising,
a semiconductor die;
an isolation layer affixed to said semiconductor die; a first radiation-shielding layer affixed to said isolation layer and which corresponds substantially equally in size to said semiconductor die; and
a second radiation-shielding layer which corresponds substantially equally in size to said semiconductor die.

62. A device, comprising:
a semiconductor die having a surface;
a first radiation-shielding layer affixed directly to said surface of said semiconductor die with an electrically insulative adhesive therebetween and which corresponds substantially equally in size to said semiconductor die; and
a second radiation-shielding layer which corresponds substantially equally in size to said semiconductor die.

63. The device of claim 62, wherein:
said surface of said semiconductor die is an active surface of said semiconductor die.

64. The device of claim 62, wherein:
said radiation-shielding layer comprises an organic polymer.

65. The device of claim 62, wherein:
said electrically insulative adhesive is a curable epoxy.

66. The device of claim 62, wherein:
said electrically insulative adhesive is a thermally conductive.

* * * * *